United States Patent
Park et al.

(10) Patent No.: US 9,590,634 B1
(45) Date of Patent: Mar. 7, 2017

(54) METAL CONFIGURABLE HYBRID MEMORY

(71) Applicant: BaySand Inc., Morgan Hill, CA (US)

(72) Inventors: Jonathan C. Park, Morgan Hill, CA (US); Yau Kok Lai, Penang (MY); Teck Siong Ong, Penang (MY); Yin Hao Liew, Penang (MY)

(73) Assignee: BAYSAND INC., Morgan Hill, CA (US)

( * ) Notice: Subject to any disclaimer, the term of this patent is extended or adjusted under 35 U.S.C. 154(b) by 0 days.

(21) Appl. No.: 15/181,007

(22) Filed: Jun. 13, 2016

(51) Int. Cl.
| | |
|---|---|
| H03K 19/177 | (2006.01) |
| H01L 27/118 | (2006.01) |
| H03K 19/00 | (2006.01) |
| H03K 19/173 | (2006.01) |
| G11C 7/10 | (2006.01) |

(52) U.S. Cl.
CPC ..... H03K 19/17724 (2013.01); G11C 7/1045 (2013.01); H01L 27/11807 (2013.01); H03K 19/0008 (2013.01); H03K 19/1731 (2013.01); H03K 19/1776 (2013.01); H01L 2027/11812 (2013.01); H01L 2027/11838 (2013.01); H01L 2027/11881 (2013.01)

(58) Field of Classification Search
CPC . H01L 2027/11812; H01L 2027/11838; H01L 2027/11881; H01L 27/11807; H03K 19/0008; H03K 19/1731; H03K 19/17724
See application file for complete search history.

(56) References Cited

U.S. PATENT DOCUMENTS

| | | | | |
|---|---|---|---|---|
| 5,835,427 | A | * | 11/1998 | McClure ................ G11C 29/50 365/189.11 |
| 6,075,380 | A | * | 6/2000 | Lane ........................ G06F 1/03 326/39 |
| 6,134,173 | A | * | 10/2000 | Cliff ........................ G11C 8/12 365/189.02 |
| 7,541,833 | B1 | * | 6/2009 | Neuendorffer ... H03K 19/17756 326/38 |
| 7,864,620 | B1 | * | 1/2011 | Pedersen .............. G11C 7/1006 365/154 |

(Continued)

*Primary Examiner* — Alexander H Taningco
*Assistant Examiner* — Kurtis R Bahr
(74) *Attorney, Agent, or Firm* — Foley & Lardner LLP; Mark J. Danielson

(57) ABSTRACT

Embodiments of the invention relate to a metal configurable hybrid memory for use in integrated circuit designs for implementation in structured ASIC or similar platforms utilizing a base cell or standard cell. In accordance with certain aspects, a hybrid memory according to embodiments of the invention utilizes a fixed custom memory core and a customizable peripheral set of base cells. In accordance with these and further aspects, the hybrid memory can be specified using a macro, in which certain memory features (e.g. ECC, etc.) are implemented using the customizable peripheral set of base cells, and which may be selected or omitted from the design by the user. This enables the overall logic use for the memory to be optimized for a user's particular design. Unused logic in the customizable peripheral set of base cells can thus be freed for top-level logic use, thereby optimizing the design according to a user's functional and dimensional requirements and minimizing unnecessary waste of silicon area and power.

12 Claims, 10 Drawing Sheets

(56) References Cited

U.S. PATENT DOCUMENTS

| | | | |
|---|---|---|---|
| 8,436,646 B1* | 5/2013 | Mendel | H03K 19/17724 |
| | | | 326/38 |
| 8,533,641 B2 | 9/2013 | Park et al. | |
| 8,631,365 B2 | 1/2014 | Kengeri et al. | |
| 8,837,249 B2* | 9/2014 | Romanovskyy | G11C 7/1045 |
| | | | 365/189.05 |
| 8,875,080 B1 | 10/2014 | Parks et al. | |
| 9,019,782 B2 | 4/2015 | Katoch | |
| 9,075,930 B2* | 7/2015 | Kumar | G11C 7/1069 |
| 9,218,872 B1 | 12/2015 | Liaw | |
| 9,336,342 B2 | 5/2016 | Zorian et al. | |
| 2004/0120182 A1* | 6/2004 | Biyani | G11C 5/145 |
| | | | 365/156 |
| 2006/0126419 A1* | 6/2006 | Hong | G11C 8/12 |
| | | | 365/230.03 |
| 2013/0087834 A1* | 4/2013 | Park | H01L 27/11807 |
| | | | 257/204 |
| 2013/0162290 A1* | 6/2013 | Margabandu | H03K 19/17756 |
| | | | 326/38 |
| 2014/0247525 A1 | 9/2014 | Parks et al. | |
| 2015/0048425 A1 | 2/2015 | Park et al. | |

\* cited by examiner

FIG. 6B
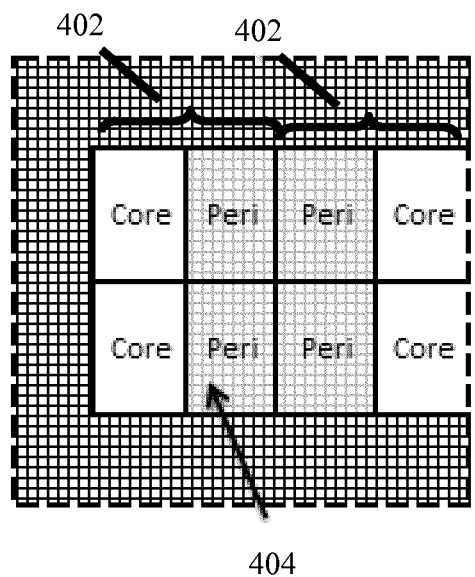
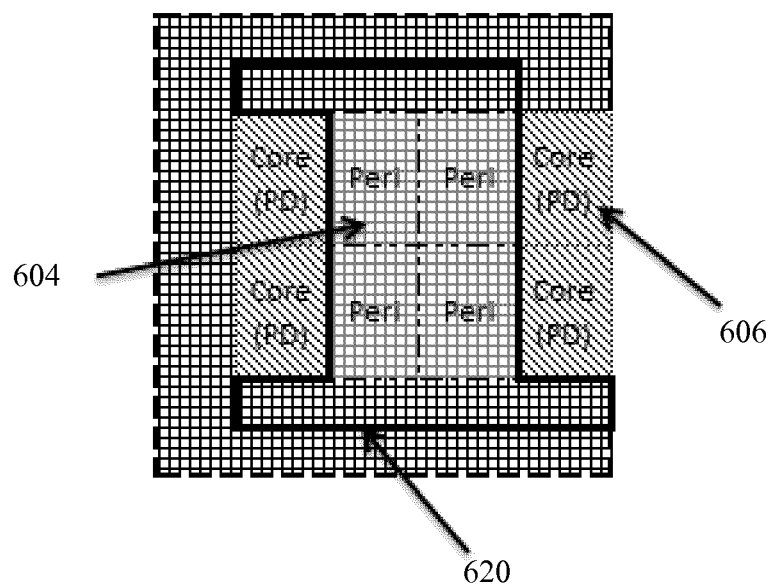
FIG. 6C

METAL CONFIGURABLE HYBRID MEMORY

FIELD OF THE INVENTION

The present invention relates generally to integrated circuits and more particularly, to configurable memory macros for use in integrated circuit designs such as structured ASIC designs or metal configurable ASIC designs.

BACKGROUND OF THE INVENTION

Application specific integrated circuit (ASIC) design methodologies allow for certain components such as memory to be specified and included in specific circuit designs using macros. However, conventional memory macros typically found in existing structured ASIC designs embed a substantial amount of logic to support all the memory features (e.g. redundancy, ECC and etc.) that may potentially be desired by all users. If certain designs do not actually need to include a memory having all of these features, using these macros requires a larger silicon area than is actually necessary to build the memory. Moreover, using these macros might lead to a reduction in memory performance if the extra/unused features are built on a critical path in the memory. Still further, extra parasitic capacitance contributed by these extra functions/logic will result in higher memory power consumption than is otherwise necessary.

U.S. Pat. Nos. 9,336,342, 9,218,872, 9,075,930, 9,019,782, 8,837,249 and 8,631,365 describe various aspects of conventional memory macros but they all suffer from the problems described above, among others.

Accordingly, a need exists for a solution to these and other problems.

SUMMARY OF THE INVENTION

Embodiments of the invention relate to a metal configurable hybrid memory for use in integrated circuit designs for implementation in structured ASIC or similar platforms utilizing a base cell or standard cell. In accordance with certain aspects, a hybrid memory according to embodiments of the invention utilizes a fixed custom memory core and a customizable peripheral set of base cells. In accordance with these and further aspects, the hybrid memory can be specified using a macro, in which certain memory features (e.g. ECC, etc.) are implemented using the customizable peripheral logic design using a set of metal configurable base cells, and which may be selected or omitted from the design by the user. This enables the overall logic use for the memory to be optimized for a user's particular design. Unused logic in the customizable peripheral set of base cells can thus be freed for top-level logic use, thereby optimizing the design according to a user's functional and dimensional requirements and minimizing unnecessary waste of silicon area and power.

According to certain additional aspects, a top-level tiling/cascading methodology and use of glue-logic using metal configurable base cells can make the overall memory solution more flexible in terms of customization of memory functionality and optimal in terms of silicon area, power and performance. Still further, such methodology and glue-logic can easily transform a non-configurable customer memory or memory compiler macro to a configurable memory macro.

BRIEF DESCRIPTION OF THE DRAWINGS

These and other aspects and features of the present invention will become apparent to those ordinarily skilled in the art upon review of the following description of specific embodiments of the invention in conjunction with the accompanying figures, wherein:

FIGS. 6A to 6F are diagrams illustrating aspects of reusing logic resources that are unused by a hybrid memory macro, as well as tiling/cascading and glue logic aspects of embodiments of the invention.

DETAILED DESCRIPTION OF THE PREFERRED EMBODIMENTS

The present invention will now be described in detail with reference to the drawings, which are provided as illustrative examples of the invention so as to enable those skilled in the art to practice the invention. Notably, the figures and examples below are not meant to limit the scope of the present invention to a single embodiment, but other embodiments are possible by way of interchange of some or all of the described or illustrated elements. Moreover, where certain elements of the present invention can be partially or fully implemented using known components, only those portions of such known components that are necessary for an understanding of the present invention will be described, and detailed descriptions of other portions of such known components will be omitted so as not to obscure the invention. Embodiments described as being implemented in software should not be limited thereto, but can include embodiments implemented in hardware, or combinations of software and hardware, and vice-versa, as will be apparent to those skilled in the art, unless otherwise specified herein. In the present specification, an embodiment showing a singular component should not be considered limiting; rather, the invention is intended to encompass other embodiments including a plurality of the same component, and vice-versa, unless explicitly stated otherwise herein. Moreover, applicants do not intend for any term in the specification or claims to be ascribed an uncommon or special meaning unless explicitly set forth as such. Further, the present invention encompasses present and future known equivalents to the known components referred to herein by way of illustration.

According to certain general aspects, embodiments of the invention are directed to a configurable memory for a structured ASIC or similar integrated circuit having base cells or standard cells, and which can be implemented using macro techniques in an ASIC or similar design flow.

Figure 1:
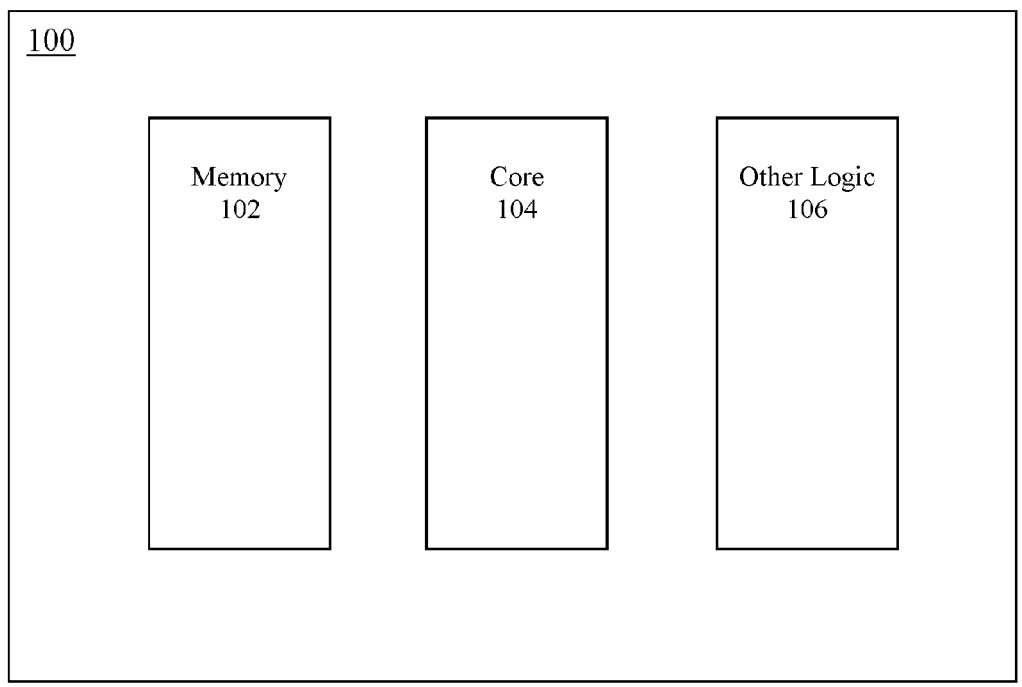
FIG. 1 is a block diagram of an example integrated circuit having a configurable memory according to embodiments of the invention.

In connection with these and other general aspects, FIG. 1 is a block diagram illustrating an example integrated circuit (IC) 100 according to embodiments of the invention. As shown, IC 100 includes memory 102, core logic 104 and other logic 106.

In embodiments, IC 100 is implemented using a CMOS technology having a base cell or standard cell platform such as structured or standard cell ASIC or the metal configurable standard cell (MCSC) technology described in U.S. Pat. No. 8,533,641, the contents of which are incorporated herein by reference in their entirety. However, the principles of the invention can be extended to other integrated circuit technologies such as FPGA, conventional or full custom ASIC, etc. Moreover, it should be noted that the invention can include integrated circuits that have been designed for one platform such as structured ASIC and then ported or converted to a different platform such as MCSC using conventional ASIC electronic design automation (EDA) tools that have been adapted and/or supplemented for performing metal configurable routing for MCSC platforms.

Memory 102 is a configurable memory according to embodiments of the invention that will be described in more detail below. It should be noted, however, that only a single memory 102 is shown purely for ease of illustration. As such IC 100 can include several memories, including several configurable memories to be described in more detail below, as well as various types of memories such as RAM, read-only memory (ROM), register files, etc.

Core logic 104 typically comprises a multiplicity of functional circuit blocks or IPs and can include microprocessors, microcontrollers, state machines and other processing units, as well as other types of logic.

Other logic 106 includes lower-level logic input/output (IO) circuitry, PHY (e.g. DDR/LVDS PHY), PLLs, transceivers, etc. In an example where IC 100 is based on MCSC technology, some or all of such other logic 106 can be implemented using techniques described in U.S. Patent Publ. No. 2014/0247525, the contents of which are incorporated by reference herein in their entirety.

Figure 2:
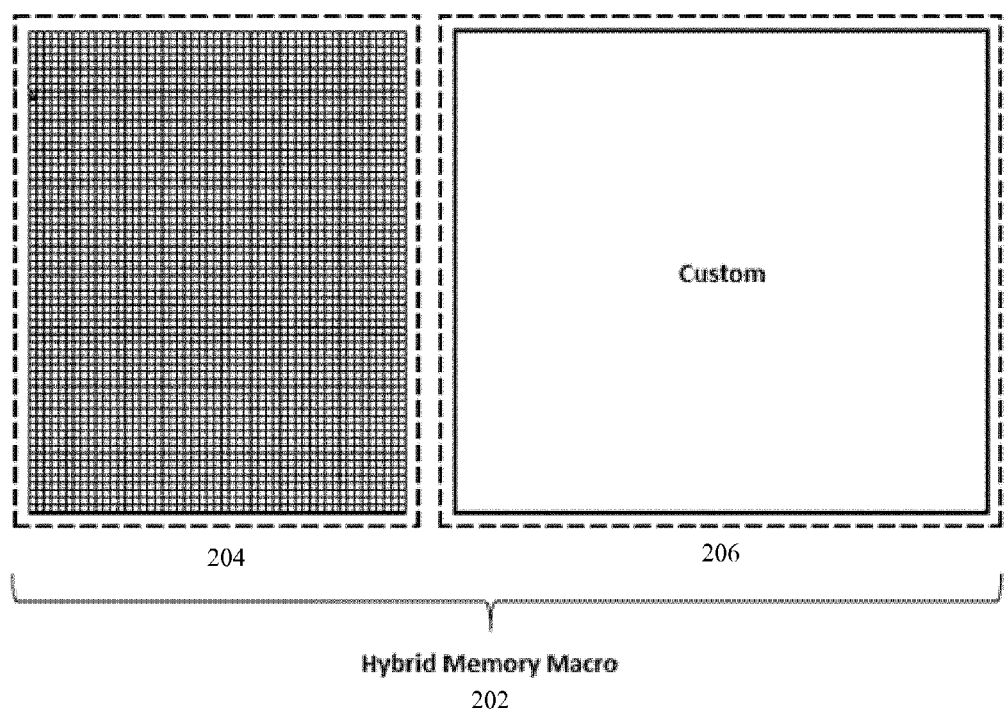
FIG. 2 is a block diagram of an example hybrid memory macro according to embodiments of the invention.

A block diagram of an example implementation of memory 102 according to embodiments of the invention is shown in FIG. 2. As shown in this example, memory 202 includes a periphery logic block 204 and custom memory core block 206.

In embodiments, periphery logic block 204 is implemented using customizable logic such as ASIC base cells or MCSC technology as will be described in more detail below. According to aspects of the invention, because the periphery logic block 204 is built using metal customizable base cells, unused periphery logic can be freed up for other user logic such as core logic 104.

Meanwhile, in these and other embodiments, custom memory core block 206 is a pre-configured or full custom memory core which may include multiplicities of timing sensitive circuits such as a Sense Amplifier (SA), Static Random Access Memory (SRAM) bit cell, Write Driver (WD), self-timed read and write control block and other timing or electrical sensitive circuits. Therefore the memory core block 206 may require full custom layout with optimized transistor device size and signal matching in order to achieve highest performance and robustness of memory operations.

In another embodiment, the customer memory core block 206 may be a memory macro with fixed functionality from memory compilers provided by a third party such as a foundry or other memory compiler providers.

Meanwhile, customizable periphery block 204, which may not require such stringent design constraints as block 206, can be implemented using MCSC technology, using MCSC standard cells or other metal configurable standard cells. As such, memory 202 in these and other embodiments of the invention is termed a "hybrid" memory.

According to aspects of the invention, the configurable periphery block 204 allows the functionality of fixed custom memory core block 206 to be configured to users' needed or desired functionality by configuring or modifying only the programmable metal layers. The memory 202 can thus be configured to various width×depth dimensions, different types of memory (e.g. true-dual-port, single port, simple dual-port memory or ROM), additional pipeline output registers, etc. For example, custom memory core block 206 may be selected in accordance with a fixed size (e.g. 9K, 10K, 20K, etc.) and maximum bit width (e.g. 32 bits) and may be configured using configurable periphery block 204 with desired functionalities (e.g. redundancy, registered outputs, etc.) in a first implementation of memory 202. A second implementation of memory 202 may have different depth×width and functionalities compared to the first implementation without changing custom memory core block 206 but only changing periphery logic block 204 by configuring or modifying only programmable metal layers as described in more detail below.

Figures 3A, 3B:
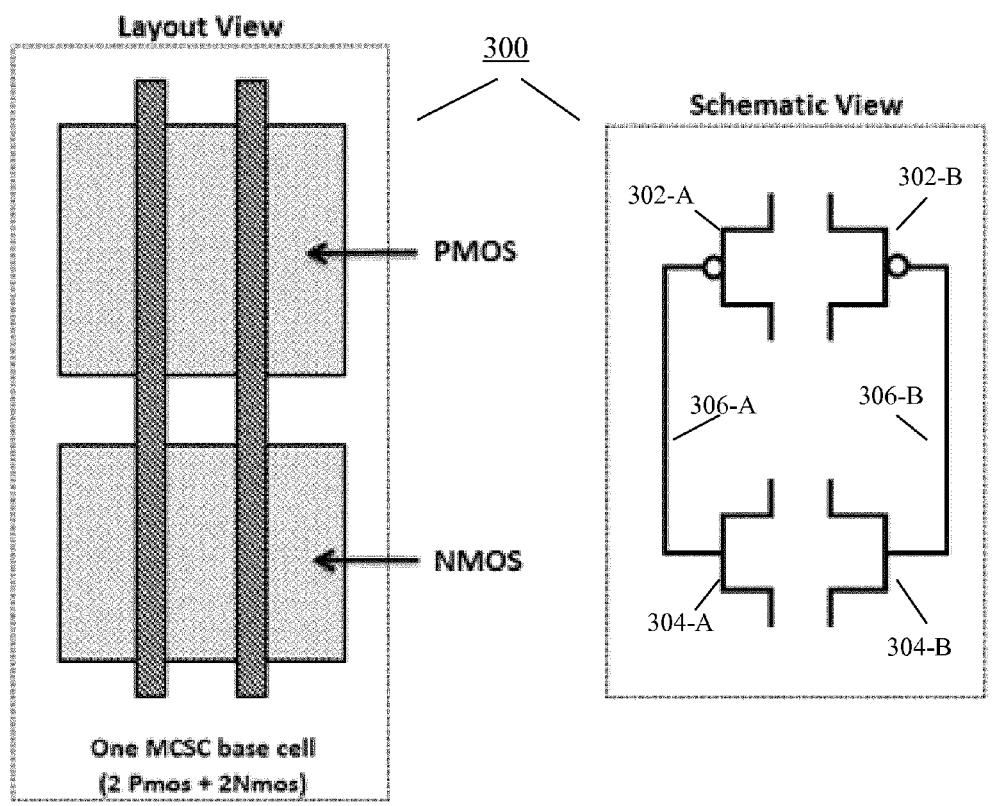
FIGS. 3A and 3B are views of an example base cell that can be used to implement a customizable portion of a hybrid memory macro such as that shown in FIG. 3 according to embodiments of the invention.

FIGS. 3A and 3B are a layout view and schematic view, respectively, that show the base cell 300 structure used in periphery block 202. As shown, it includes two PMOS transistors 302-A and B and two NMOS transistors 304-A and B, with transistor pairs having their gates connected by gate lines 306-A and B using "fixed" metal layer regions. Individual ones of cell 300 can be connected together to form metal configurable standard cells (e.g. NAND, buffers, muxes, flip-flops) using "programmable" metal layer regions as described in more detail in U.S. Pat. No. 8,533,641, the contents of which are incorporated by reference herein. These standard cells can be further connected together to form any desired user logic logic through conventional ASIC design implementation flow such as synthesis, place and route.

In example embodiments to be described in more detail below, memory 102 having a hybrid structure such as shown in that shown in FIG. 2 is implemented as a macro-cell (i.e. macro) that can be selected for a design and configured in a conventional design flow, for example from a cell library as is known in the art. Those skilled in the art will understand how to implement these and other macro embodiments of the invention after being taught by the present disclosure. It should be noted, however, that the invention is not limited to being implemented using macro-cell techniques, but can be extended to other types of design methodologies.

Figure 4:
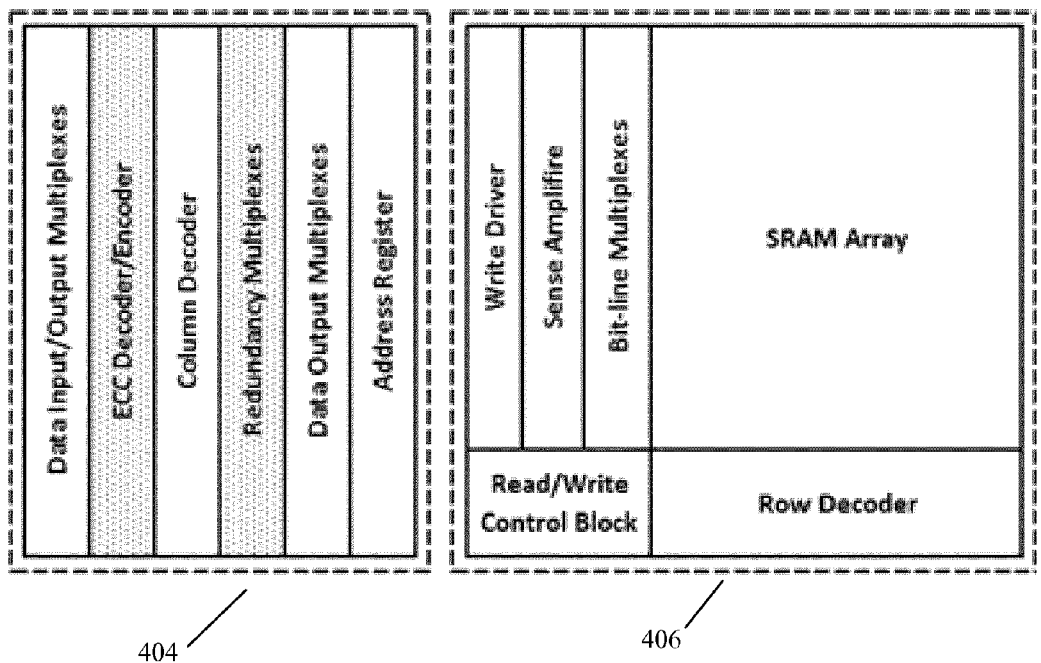
FIG. 4 is an example implementation of a hybrid memory macro such as that shown in FIG. 2 according to embodiments of the invention.

FIG. 4 is a block diagram of an example implementation of a hybrid memory macro 402 according to embodiments of the invention with all possible features enabled.

In this example shown in FIG. 4, the basic components found in peripheral logic block 404 include a data input/output register, an address register, a column decoder and data output multiplexes. Moreover, depending on user design need, the memory periphery logic 404 in this example embodiment can include error correction (ECC) and redundancy features.

The memory core 406 in this example implementation shown in FIG. 4 includes highly sensitive blocks such as a sense-Amplifier (SA), a Write Driver (WD), an SRAM array, a row-decoder, bit-line multiplexers and a read/write control block.

It should be noted that the memory functionalities and components can be implemented using any known conventional techniques and are well known to those skilled in the art. As such, further details thereof will be omitted here for sake of clarity of the invention. Moreover, it should be noted that the particular components of blocks 404 and 406 illustrated in FIG. 4 are only one possible example of the number and types of memory components that can be included in them, respectively. As such, these example embodiments should be construed as illustrative rather than limiting.

Figure 5A:
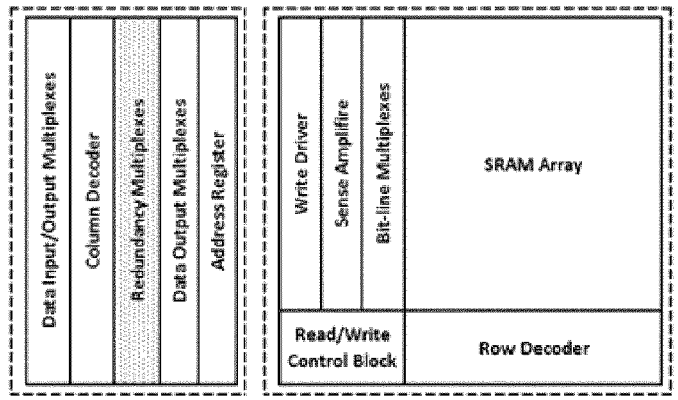
FIGS. 5A to 5C are block diagrams illustrating examples of how functionality of a hybrid memory macro can be customized by a user according to embodiments of the invention.
Figure 5B:
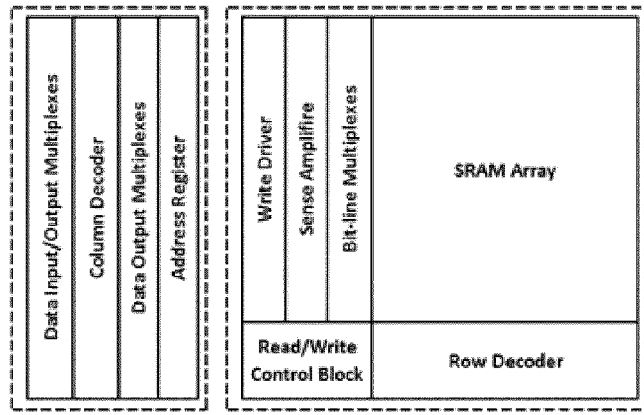
Figure 5C:
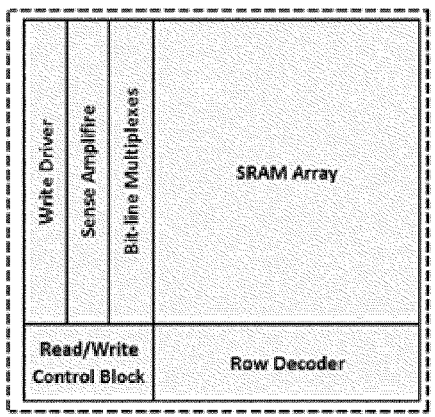

FIGS. 5A, 5B and 5C are block diagrams illustrating examples of how the principles of the invention can provide savings in relative area resulting from unused memory features according to embodiments of the invention.

In the example of FIG. 5A, peripheral logic block 504-A has been configured so as to not include functionality associated with the ECC component in full-featured peripheral logic block 404. In certain embodiments, this causes the overall area of memory 502-A to be reduced by about 10% from the area consumed by memory 402.

In the example of FIG. 5B, peripheral logic block 504-B has been configured so as to not include functionality associated with the ECC and redundancy multiplexer components in full-featured peripheral logic block 404. In certain embodiments, this causes the overall area of memory 502-B to be reduced by about 20% from the area consumed by memory 402.

In the example of FIG. 5C, the hybrid memory macro structure 402 shown in FIG. 4 has been configured so as to not include any functionality provided in full-featured peripheral logic block 404. In certain embodiments, this causes the overall area of memory 502-C to be reduced by about 50% from the area consumed by memory 402.

As set forth above, the particular functionality (e.g., some or all of the functionalities selected in FIGS. 5A to 5C), and thus the overall area consumed by memory 402, is selected using macro features in an overall ASIC or similar design flow. Those skilled in the art will understand how to adapt or supplement a conventional design flow for use in implementing a hybrid memory macro according to embodiments of the invention after being taught by the present disclosure.

As set forth above and to be described in more detail below, depending on the memory functionalities for block 404 selected for a particular design, the unused logic resources in block 404 can be either used by top-level user logic in logic 104 or they can be powered down to reduce leakage power. Unused logic in memory core block 406 can either be powered down to reduce leakage or powered up to act as extra on-die de-coupling capacitance to improve overall system power integrity. As further set forth above and to be described in more detail below, according to certain general aspects, embodiments of the invention implement top-level tiling and cascading to form bigger memory blocks with the help of MCSC technology.

FIGS. 6A to 6F illustrate example implementations of these and other aspects in further detail.

Figure 6A:
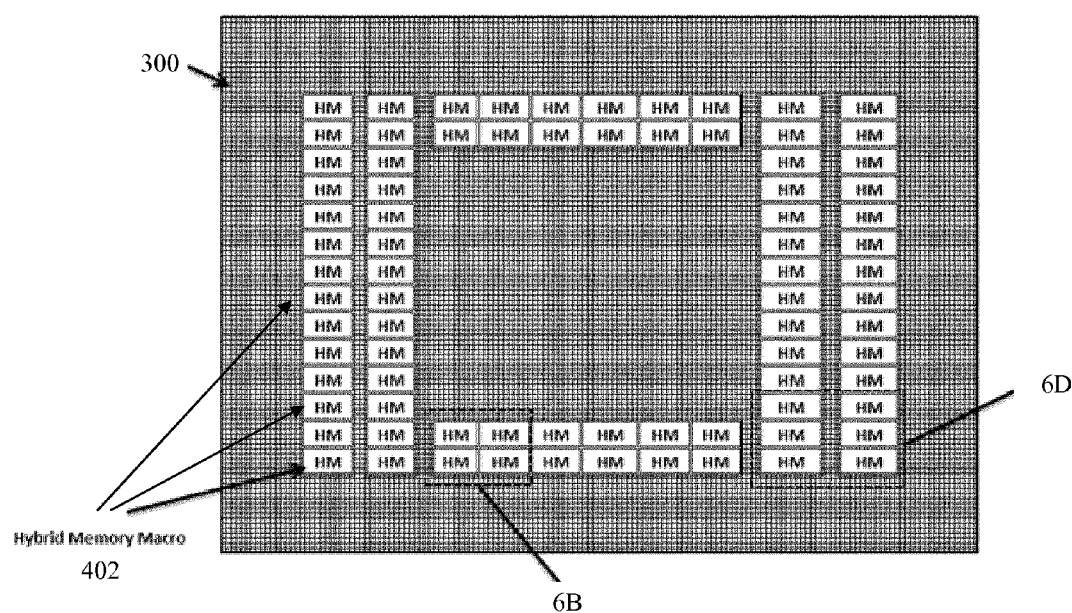

FIG. 6A illustrates an example IC 600 in which a hybrid memory 402 has been broken down into a plurality of individual pieces and distributed towards the outer boundaries of IC 600, which is otherwise comprised of an array of MCSC base cells 300.

FIG. 6B shows in more detail one example of how the individual pieces 402 of a hybrid memory according to embodiments of the invention can be formed and arranged. In this example, the peripheral logic block 404 portions and core memory block 406 portions are all adjacent to each other, with few or no base cells in between.

FIG. 6C further illustrates how embodiments of the invention such as that shown in FIG. 6B allow for more efficient use of integrated circuit blocks. First, any logic resources that are not being used by user logic can be powered down to reduce leakage by disconnecting them from the power/ground network. Similarly, as shown in FIG. 6C, any unused memory core blocks 606 can also be powered down by disconnecting the power/ground network to the blocks. Although not shown in FIG. 6C, in these and other embodiments, unused memory core blocks 606 can also be connected to the power source and configured to be used as a decoupling capacitor between power and ground to provide improved overall design power and signal integrity.

As further shown in FIG. 6C, instead of being powered down, unused MCHM periphery logic blocks 604 are freed up for top-level user logic. As still further shown, these unused logic blocks can be combined with other MCSC base cell resources to form desired user logic blocks 620.

Figure 6D:
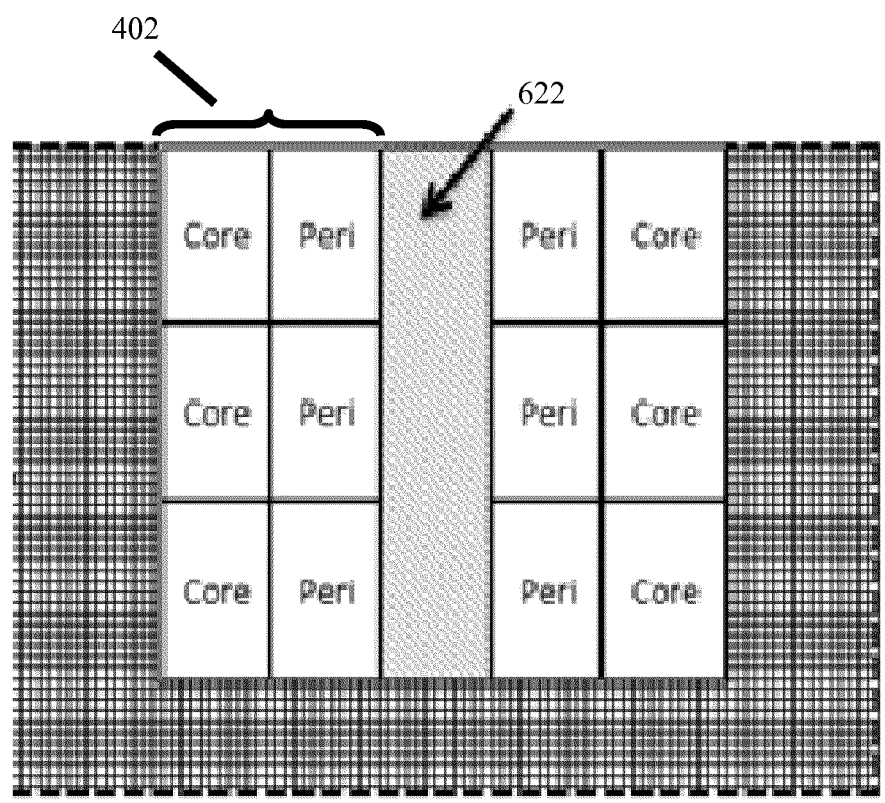
Figure 6E:
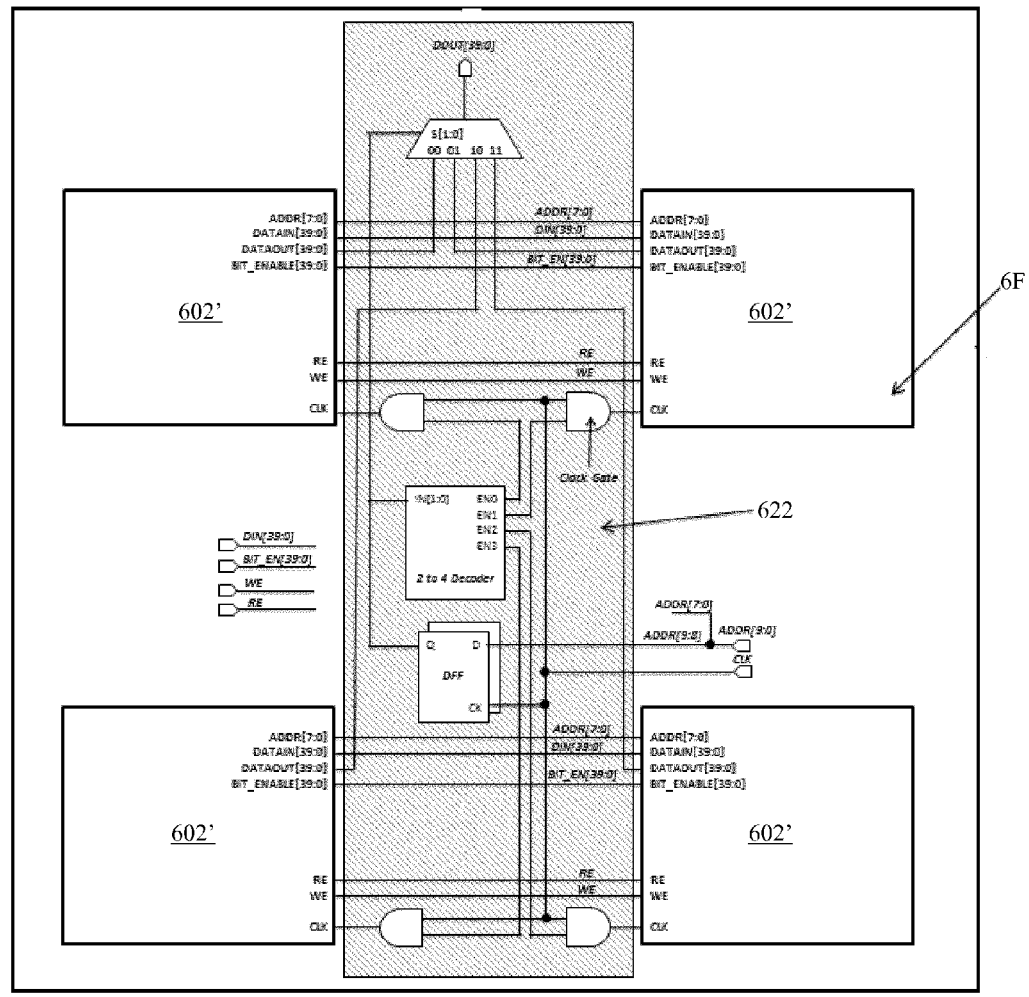
Figure 6F:
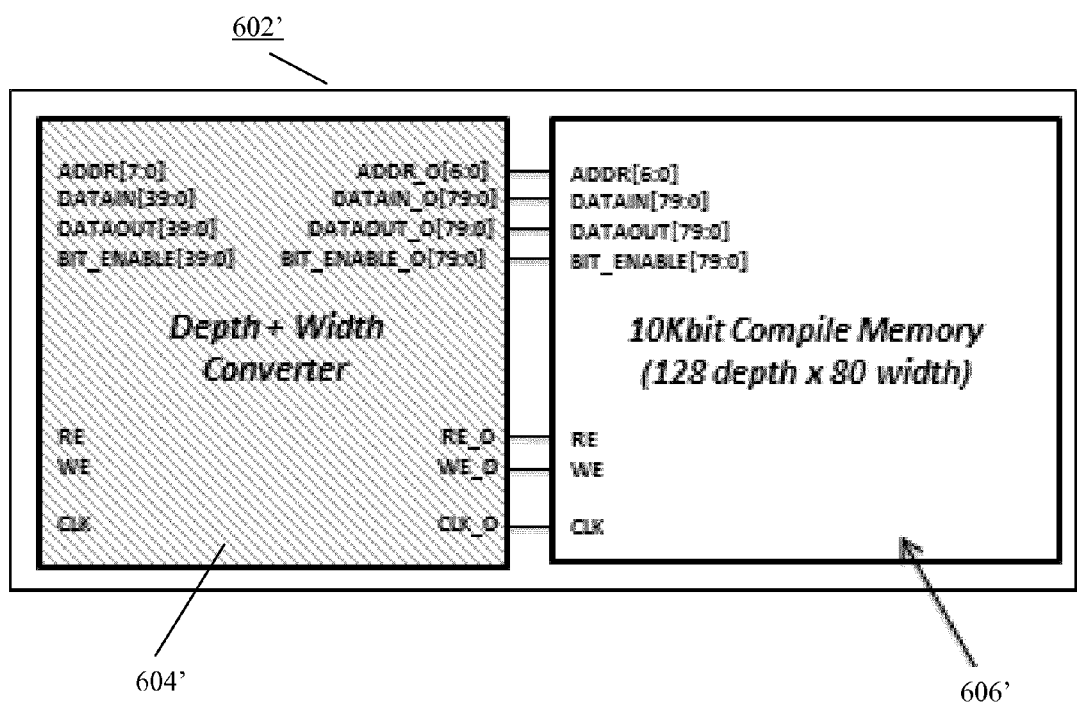

FIGS. 6D to 6F illustrate tiling/cascading and glue logic aspects of embodiments of the invention.

As set forth above, the hybrid memory macro 402 is constructed with a density (e.g. 10K-bits) that is fixed and pre-defined in accordance with the custom memory block 406. According to aspects of the invention, larger memory blocks (i.e. >10K-bits in this example) can be formed from multiple pieces of memory macro 402 combined with top level glue-logic 622 implemented using MCSC technology as shown in FIG. 6D, together with top level tiling/cascading methodologies according to embodiments of the invention as described in more detail below.

More particularly, FIG. 6E illustrates an example of building a larger 40 Kbit memory by tiling/cascading together four MCHM 10 Kbit macros. Theoretically, there is no limit on building any memory block size by using the tiling/cascading method with help of MCSC glue logic. In this example, glue logic 622 includes signal lines and components (e.g. clock gates, flip flops, multiplexers and decoders) that allow the individual four MCHM 10 Kbit macros to be used as a single 40 Kbit memory.

FIG. 6F shows an example 10 Kbit macro 602' that can be used to implement the MCHM 10 Kbit macro in FIG. 6E, and further illustrates additional aspects of the invention. In this example, memory macro 602' includes an industry compiled memory IP core 606' that is transformed into a configurable memory block by peripheral logic block 604'. This is due to the capabilities of MCSC to configure the macro as described above to include different logic functions (e.g. different dimension of row/column decoder, top level data multiplexes, etc.) and to tile/cascade multiple memory IP (compiler or custom) to form different memory dimensions (i.e. depth×width). In this example, compiled memory IP core 606' is converted from a 10 Kbit 128 depth×80 width memory to a 256 depth×40 width memory 602' by logic block 604' which implements a depth and width converter. Accordingly, with the help of the tiling and cascading flow with MCSC glue logic according to embodiments of the invention, a user can build a memory with any dimension and feature (e.g. ECC, special write modes, additional pipeline registers to boost performance, etc.) by changing only the programmable layers in MCSC. No base/lower mask layer changes are needed as is required with conventional compiled memories.

Although the present invention has been particularly described with reference to the preferred embodiments thereof, it should be readily apparent to those of ordinary skill in the art that changes and modifications in the form and details may be made without departing from the spirit and scope of the invention. It is intended that the appended claims encompass such changes and modifications.

What is claimed is:

1. An integrated circuit, comprising:
a memory having a peripheral logic block and a customized core memory block, wherein the peripheral logic block is configurable using programmable metal layers and thereby changes one or more of a feature and a dimension of the memory while the customized core memory block remains the same,
wherein unused portions of the peripheral logic block are used for building logic blocks external to the memory.

2. An integrated circuit according to claim 1, wherein the peripheral logic block comprises a plurality of base cells.

3. An integrated circuit according to claim 1, wherein the base cells comprise metal configurable standard cells (MCSC).

4. An integrated circuit according to claim 1, wherein the customized core memory block comprises full custom application specific integrated circuit (ASIC) cells.

5. An integrated circuit according to claim 1, wherein the customized core memory block comprises a compiled memory.

6. An integrated circuit according to claim 1, wherein unused portions of the customized core memory block are not connected to power lines of the integrated circuit.

7. An integrated circuit according to claim 1, wherein unused portions of the customized core memory block are connected to power lines of the integrated circuit for improving an overall power integrity of the integrated circuit.

8. An integrated circuit according to claim 1, wherein the memory further comprises glue logic that connects a plurality of the peripheral logic blocks and customized core memory blocks together for combined operation as a single memory.

9. An integrated circuit according to claim 1, wherein the feature and functionality includes ECC functionality, and wherein the peripheral logic block is configurable such that the memory optionally includes the ECC functionality.

10. An integrated circuit according to claim 1, wherein the feature and functionality includes redundancy multiplexer functionality, and wherein the peripheral logic block is configurable such that the memory optionally includes the redundancy multiplexer functionality.

11. An integrated circuit according to claim 1, wherein the customized core memory includes a fixed size memory array.

12. An integrated circuit according to claim 11, wherein the customized core memory further includes one or more of a sense amplifier, a row decoder, a write driver and a read/write control block.

* * * * *